(12) United States Patent
Rhee et al.

(10) Patent No.: US 7,348,860 B2
(45) Date of Patent: Mar. 25, 2008

(54) TRIPLE-INPUT RELAXATION OSCILLATOR WITH DIFFERENTIAL CONTROLLABILITY

(75) Inventors: Woogeun Rhee, Norwood, NJ (US); Daniel J. Friedman, Sleepy Hollow, NY (US); Babak Soltanian, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 1 day.

(21) Appl. No.: 11/332,610

(22) Filed: Jan. 13, 2006

(65) Prior Publication Data

US 2007/0164831 A1    Jul. 19, 2007

(51) Int. Cl.
 *H03K 3/282* (2006.01)
(52) U.S. Cl. .................. 331/143; 331/111; 331/113 R; 331/144; 331/177 V
(58) Field of Classification Search .............. 331/34, 331/36 C, 108 R, 111, 113 R, 143, 144, 177 R, 331/177 V
 See application file for complete search history.

(56) References Cited

U.S. PATENT DOCUMENTS

| | | | |
|---|---|---|---|
| 6,377,129 B1 | 4/2002 | Rhee et al. | |
| 6,545,555 B1 * | 4/2003 | Justice et al. | 331/117 R |
| 6,784,755 B2 * | 8/2004 | Lin et al. | 331/57 |

OTHER PUBLICATIONS

S.-P. Woyciehowsky and R.N. Nottenburg, "10 GHz LC-tuned VCO with coarse and fine frequency control", May 22, 1997, Electronic Letters, vol. 33, No. 11, pp. 917-918.*
W. Rhee, "A Low Power, Wide Linear-Range CMOS Voltage-Controlled Oscillator", IEEE ISCAS, May 1998, pp. II-85 to II-88.
J. Kim, et al., A 44GHz differentially tuned VCO with 4GHz tuning range in 0.12um SOI CMOS, ISSCC, Feb. 2005; pp. 416-417 & 607.
Ian A. Young, et al., "A PLL Clock Generator with 5 to 110 MHz of Lock Range for Microprocessors", IEEE Journal of Solid-State Circuits; vol. 27, No. 11, Nov. 1992; pp. 1599-1607.

* cited by examiner

*Primary Examiner*—Robert J. Pascal
*Assistant Examiner*—Ryan J Johnson
(74) *Attorney, Agent, or Firm*—Keusey, Tutunjian & Bitetto, P.C.; Anne V. Dougherty, Esq.

(57) ABSTRACT

There are provided relaxation oscillators and methods for controlling the same. A relaxation oscillator includes a load device, a switching device, a fine-tuning varactor, and a current source. The load device is configured to provide a variable oscillator output based on a variable input reference voltage. The switching device is connected in signal communication with the load device and is configured to become active and inactive based on the variable oscillator output. The fine-tuning varactor is connected in signal communication with the switching device and is configured to provide fine-tuning of the variable oscillator output when the switching device is active. The current source is connected in signal communication with the switching device and is configured to provide coarse-tuning of the variable oscillator output when the switching device is active.

19 Claims, 7 Drawing Sheets

TRIPLE-INPUT RELAXATION OSCILLATOR WITH DIFFERENTIAL CONTROLLABILITY

BACKGROUND

1. Technical Field

The present invention generally relates to oscillators and, more particularly, to a voltage or current controlled relaxation oscillator using a differential signal.

2. Description of the Related Art

A voltage-controlled oscillator (VCO) is one of the most critical building blocks in phase-locked loop (PLL) design. For digital clock generation, current-starved ring VCOs have been primarily used in monolithic PLLs since they provide a wide tuning range and high integration. See, e.g., Young et. al, "A PLL clock generator with 5 to 110 MHz of lock range for microprocessors", IEEE Journal of Solid-State Circuits, November 1992, the disclosure of which is incorporated by reference herein. Turning to FIG. 1A, a current-starved ring VCO is indicated generally by the reference numeral 100. The current-starved ring VCO 100 includes a plurality of current sources 102 and a plurality of delay elements 105. The oscillation frequency of the current-starved ring VCO is directly related to the delay time of each delay element 105, resulting in high sensitivity to process, voltage, and temperature (PVT) variation. The nonlinear voltage-to-frequency transfer characteristic of the current-starved ring VCO also provides a low VCO gain at high frequencies, which is not desirable in PLL design.

Turning to FIG. 1B, a relaxation oscillator with a grounded timing-capacitor is indicated generally by the reference numeral 140. The relaxation oscillator 140 includes a plurality of current sources 142, the grounded-timing capacitor 144, and a Schmitt trigger 146. Since the oscillation frequency is fully characterized by the current, the capacitor and the reference voltage, it has a good linear-tuning-range. If the capacitor value increases, both the center frequency and the VCO sensitivity decrease with the same proportion. At high speed, however, the delay time of the latch plays a significant role in determining the oscillation period and the performance of the VCO will be degraded. Due to the single-ended structure of the relaxation oscillator 140, a 50% duty cycle and a good supply-noise-rejection cannot be easily obtained. A semi-differential architecture which employs two single-ended VCOs has been proposed to yield a 50% duty cycle and to relax the delay time requirement of the latch at high speed, but it requires two timing capacitors and consumes more power.

Turning to FIG. 1C, a source-coupled relaxation oscillator with a floating timing-capacitor is indicated generally by the reference numeral 180. The source-coupled relaxation oscillator 180 includes a plurality of current sources 182, the floating point timing capacitor 184, and a plurality of transistors 187. The source-coupled relaxation oscillator has poor voltage-to-frequency characteristics mainly due to the nonlinear load transistors. This is even worse in CMOS since the CMOS diode characteristic is not as good as the bipolar diode characteristic. Thus, this architecture is seldom used for CMOS VCOs. Nonetheless, the architecture of the source-coupled relaxation oscillator 180 has several advantages. For example, the source-coupled relaxation oscillator 180 has only one differential stage with the minimum number of the transistors. The simple architecture of the source-coupled relaxation oscillator 180 offers low power consumption and its differential operation provides a 50% duty cycle. Moreover, the source-coupled relaxation oscillator 180 also provides supply noise rejection since the signal is fully differential at zero-time crossing where the jitter performance is mainly determined.

As discussed previously, the arrangement of a relaxation oscillator with a floating capacitor is attractive if it can provide wide linear-range and less sensitivity to process variations at high speed. The main limitation of this arrangement comes from the nonlinear amplitude-dependency on the tail current. A similar technique to that used in ring-oscillator-based VCOs with differential delay cells has been employed to achieve the constant amplitude. See, e.g., the above-reference article by Young et. al, entitled "A PLL clock generator with 5 to 110 MHz of lock range for microprocessors". By using this technique on the relaxation oscillator with a floating capacitor, the operation becomes very close to that of the oscillator with a grounded capacitor and its limitation becomes very relaxed. Turning to FIG. 2, a programmable relaxation VCO with constant amplitude is indicated generally by the reference numeral 200. The programmable relaxation VCO 200 includes a replica cell 210, a plurality of capacitors C1 through CN, a plurality of transistors M1, M2, M3, M4, and a plurality of adjustable current sources 240. Such an arrangement is further described, e.g., in U.S. Pat. No. 6,377,129, entitled "Programmable Relaxation Oscillator," and incorporated by reference herein. As shown in FIG. 2, the effective load resistances of M3 and M4 are controlled by the replica cell 210 to maintain a constant voltage swing at nodes A and B. Accordingly, the oscillation frequency is determined in a way similar to the relaxation oscillator with a grounded capacitor but at a comparable power savings, and a 50% duty-cycle can be obtained due to its simple and symmetric structure.

SUMMARY

The present invention is directed to a voltage or current controlled relaxation oscillator with differential controllability.

According to an aspect of the present invention, there is provided a relaxation oscillator including a load device, a switching device, a fine-tuning varactor, and a current source. The load device is configured to provide a variable oscillator output based on a variable input reference voltage. The switching device is connected in signal communication with the load device and is configured to become active and inactive based on the variable oscillator output. The fine-tuning varactor is connected in signal communication with the switching device and is configured to provide fine-tuning of the variable oscillator output when the switching device is active. The current source is connected in signal communication with the switching device and is configured to provide coarse-tuning of the variable oscillator output when the switching device is active.

According to another aspect of the present invention, there is provided a method of controlling a relaxation oscillator having a variable oscillator output. The method includes the step of varying a capacitance of a varactor to provide fine-tuning of the variable oscillator output. The method further includes the step of varying a bias current of a current source to provide coarse-tuning of the variable oscillator output.

These and other objects, features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFFERED EMBODIMENTS

The present invention is directed to a voltage or current controlled relaxation oscillator with differential controllability.

It should be understood that the elements shown in the FIGURES may be implemented in various forms of hardware, software or combinations thereof.

The circuit(s) shown and described herein may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips.

Figure 3:
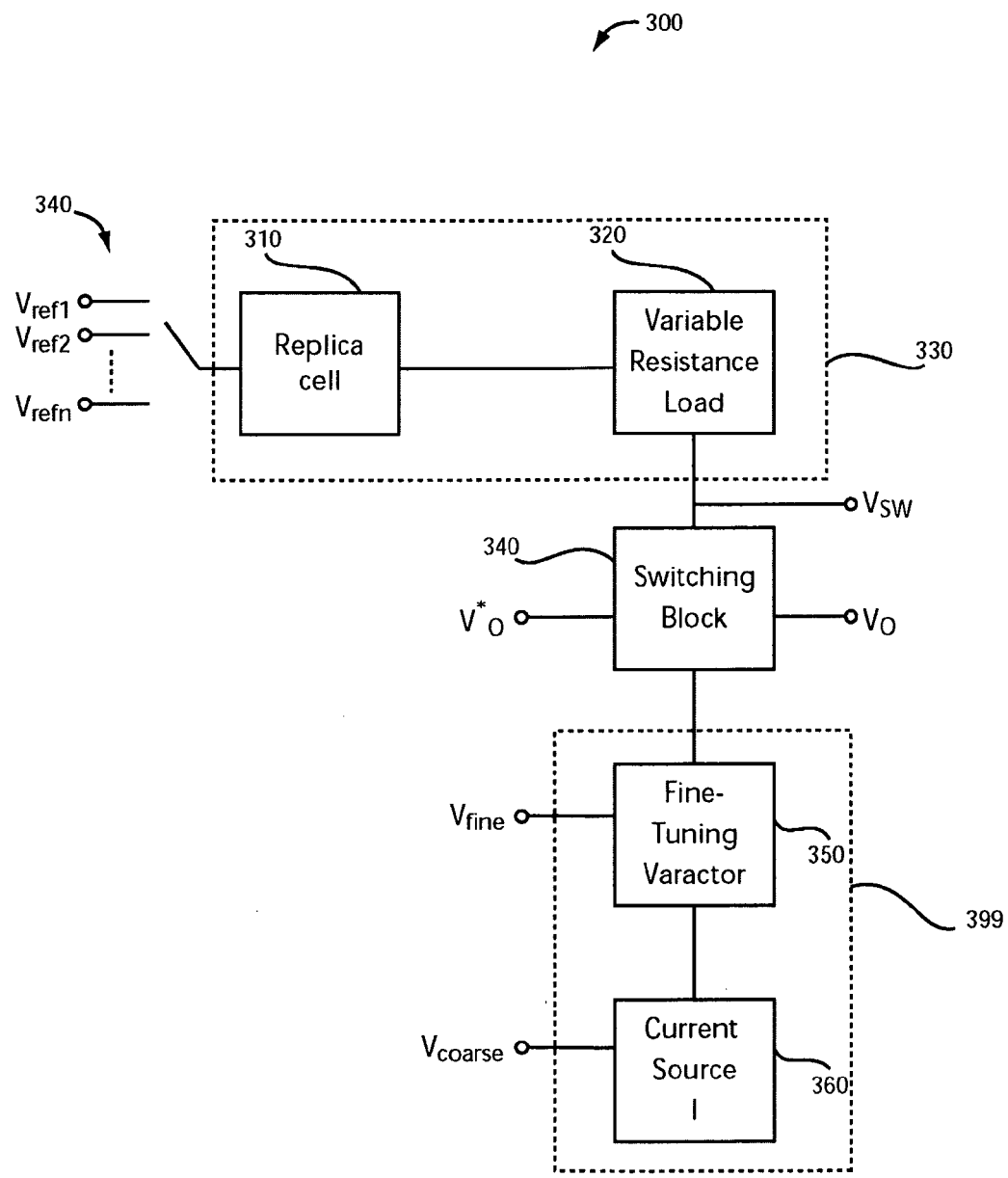
FIG. 3 is a diagram of a triple-input relaxation oscillator having a programmable swing control, coarse tuning current control, and fine tuning voltage control inputs, in accordance with the present principles.

Turning to FIG. 3, a relaxation VCO employing a single fine-tuning varactor controlled by an analog control voltage is indicated generally by the reference numeral 300. The oscillator 300 includes a replica cell 310, a variable resistance load 320, a switching block 340, a fine-tuning varactor 350, and a current source 360. The fine-tuning varactor 350 and the current source 360 form a delay control circuit 399. The replica cell 310 and the variable resistance load 320 form a swing fixing circuit 330 to fix a swing voltage $V_{SW}$. The frequency of the output clock signals $V_o$ and $V^*_o$ may be "fine-tuned" through the selection of $V_{fine}$ and "coarse-tuned" through the selection of $V_{coarse}$.

Figure 4:
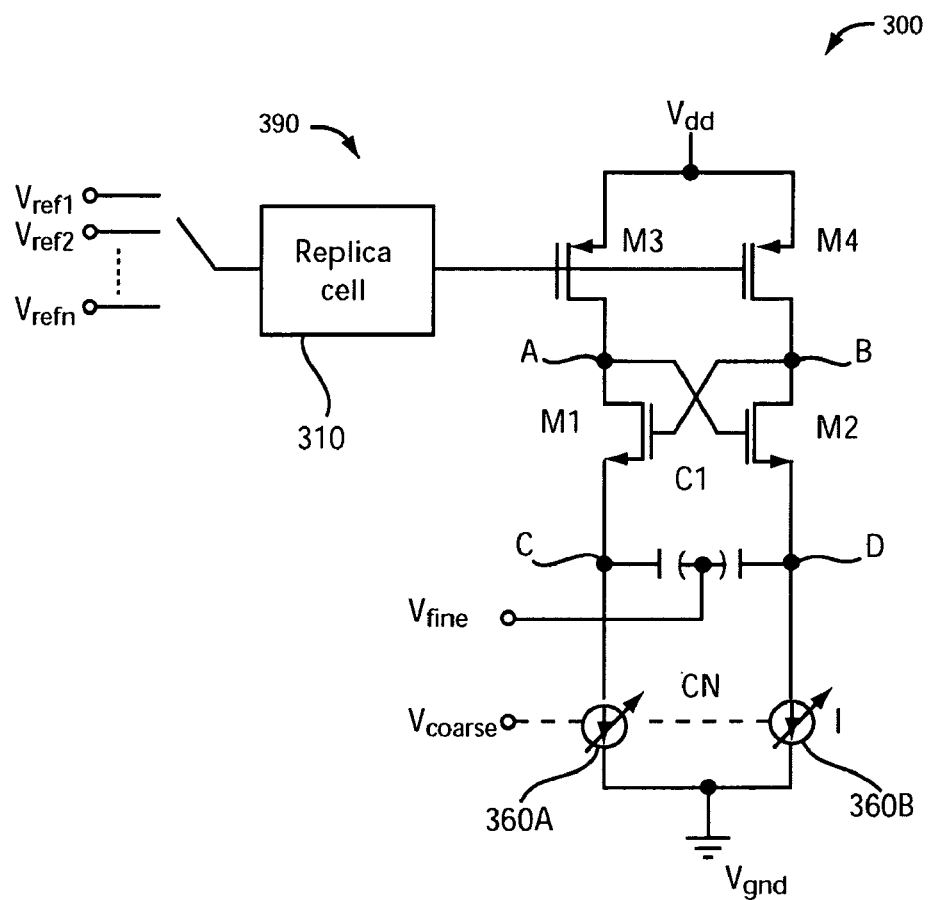
FIG. 4 is a diagram further illustrating the triple-input relaxation oscillator of FIG. 3 in accordance with an exemplary embodiment thereof.

Turning to FIG. 4, the relaxation VCO of FIG. 3 is shown in further detail in accordance with an exemplary embodiment thereof. Of course, given the teachings of the present invention provided herein, one of ordinary skill in this and related arts will contemplate these and other elements for implementing the elements shown and described with respect to FIG. 4, while maintaining the scope of the present invention.

The swing fixing circuit 330 is implemented by replica cell 310 and p-channel CMOS load transistors (hereinafter "load transistors") M3 and M4. Thus, the variable resistance load 320 of the swing fixing circuit 330 is implemented by the load transistors M3 and M4.

The switching block 340 is implemented by n-channel CMOS switching transistors (hereinafter "switching transistors") M1 and M2.

The fine-tuning varactor 350 is implemented by capacitor C1. The current source 360 is implemented by ground current sources (hereinafter "current sources") 360A and 360B. The delay control circuit 399 is implemented by the capacitor C1 and the ground current sources 360A and 360B.

Respective sources of the load transistors M3 and M4 are connected in signal communication with a supply voltage $V_{dd}$, and respective gates of the load transistors M3 and M4 are connected in signal communication with an output of a replica cell 310. An input of the replica cell 310 is configured to receive one of a plurality of reference voltages $V_{ref1}$ through $V_{refn}$. Respective drains of the load transistors M3 and M4 are connected in signal communication with nodes A and B, respectively, with respective drains of switching transistors M1 and M2, respectively, and with respective gates of switching transistors M2 and M1, respectively. Respective sources of the transistors M1 and M2 are connected in signal communication with nodes C and D, respectively. Node C is connected in signal communication with a first end of the fine-tuning varactor C1 and with a first terminal of current source 360A. Node D is connected in signal communication with a second end of the fine-tuning varactor C1, and with a first terminal of current source 360B. Respective second terminals of the current sources 360A and 360B are connected in signal communication with a ground voltage $V_{gnd}$.

The relaxation VCO 300 has dual inputs, where coarse frequency tuning is done by the current-controlled delay input $V_{coarse}$ and fine frequency tuning is done by the voltage-controlled delay input $V_{fine}$. The coarse frequency tuning also reduces the control voltage range of the fine-tuning varactor C1. The reduced control voltage range of the fine-tuning varactor C1 provides linear VCO gain as well as minimum VCO gain variation over a wide tuning range. Also, the reduced voltage range in the loop filter enhances static phase offset performance of the PLL by easing charge pump design. In addition to the coarse frequency tuning, another control can be achieved with a programmable reference voltage ($V_{ref1}$ through $V_{refn}$) which will set the VCO output swing. Since the VCO output swing is an important parameter to determine noise performance as well as the tuning range, the controlled output swing can be used to optimize the noise performance over process variation.

As noted above, the swing fixing circuit 330 is implemented by replica cell and transistors M3 and M4, with the sources of transistors M3 and M4 connected in signal communication with supply voltage $V_{DD}$ and the gates of transistors M3 and M4 connected in signal communication with replica cell 310. The reference voltage $V_{ref}$ provided by replica cell 310 is programmable to control the voltage swing $V_{SW}$ across transistors M3 and M4, wherein $V_{ref}=V_{dd}-V_{sw}$. The replica cell senses the voltage swing and adjusts the effective load resistances of M3 and M4 (namely $R_{M3}$ and $R_{M4}$, respectively) to set the voltage swing $V_{sw}$ to $V_{dd}-V_{ref}$. The effective load resistance is defined as follows: $R_{M3}=R_{M4}=1/(\mu_{p3,4}C_{ox}(V_{GS3,4}-V_{T3,4})(W_{3,4}/L_{3,4}))$, where $\mu_{3,4}$ represents the mobility of the holes in a p-channel transistor, $C_{ox}$ represents oxide capacitance, $V_{GS3,4}$ represents the gate-source voltage, $V_{T3,4}$ represents the threshold voltage, $W_{3,4}$ represents the channel width, and $L_{3,4}$ represents the channel length, all for transistors M3/M4. The voltage swing limits the swing of the VCO output signal.

Also as noted above, the switching block 340 is implemented by n-channel CMOS switching transistors M1 and M2 that have their drains connected in signal communication with the drains of load transistors M3 and M4. Moreover, as noted above, the gate of switching transistors M1 is cross-coupled to the drain of load transistor M4, and the gate of switching transistor M2 is cross-coupled to the drain of load transistors M3. The output clock signal ($V_o$, $V^*_o$) is provided at the coupled drains of the load and switching transistors, namely nodes A and B.

Delay control is implemented by fine-tuning varactor C1 and current sources 360A and 360B. The current sources 360A and 360B each provide a reference current I, the value of which may be established by a current digital-to-analog converter (DAC). The fine-tuning varactor C1 is fixably connected between the sources of switching transistors M1 and M2. The effective capacitance C provided by the fine-tuning varactor C1 is variable by control voltage $V_C$. Hence, the output signal ($V_o$, $V^*_o$) of oscillator has a frequency that bears a certain relationship to the swing voltage $V_{sw}$, the effective capacitance C, and the control current I.

Thus, in FIG. 4, a relaxation VCO is shown employing a single fine-tuning varactor controlled by an analog control voltage, instead of having multiple programmable capacitors. The capacitance of the varactor formed of the two NFETs (or PFETs) can be continually and near instantaneously adjusted through the application of a variable control signal applied to the sources and drains of each NFET (or PFET).

Since the fine-tuning varactor 350 is controlled by an analog voltage, it is important to minimize noise sensitivity of that control path. In integrated circuits, it is advantageous to employ differential signals to provide increased immunity to on-chip noise and signal coupling.

Figure 5:
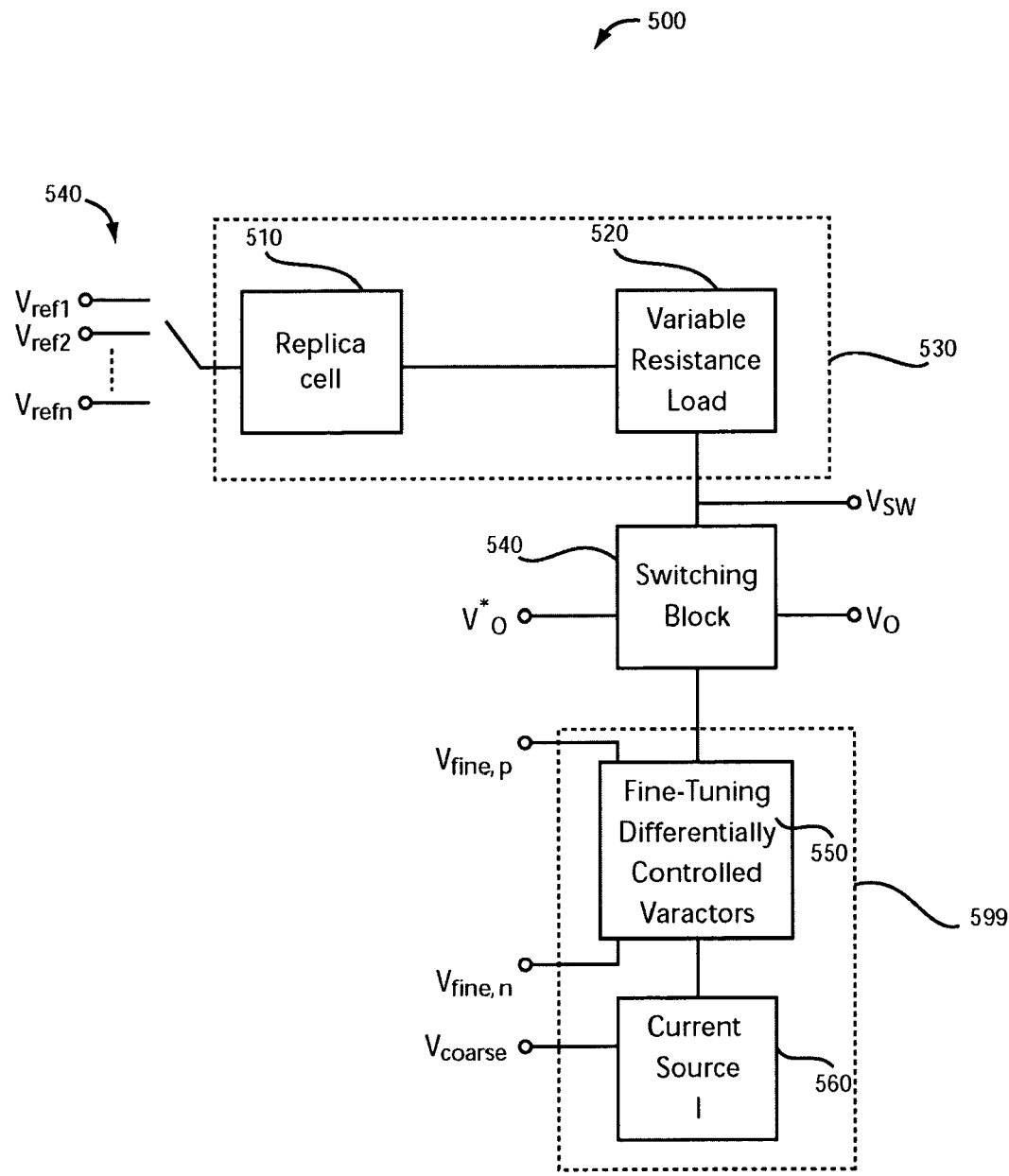
FIG. 5 is a diagram illustrating a triple-input relaxation oscillator having a differential fine tuning control input in accordance with the present principles.

Turning to FIG. 5, a triple-input relaxation oscillator having a differential fine tuning control input is indicated generally by the reference numeral 500. The oscillator 500 includes a replica cell 510, a variable resistance load 520, a switching block 540, fine-tuning differentially controlled varactors 550, and a current source 560. The fine-tuning differentially controlled varactors 550 and the current source 560 form a delay control circuit 599. The replica cell 510 and the variable resistance load 520 form a swing fixing circuit 530 to fix a swing voltage $V_{SW}$. The frequency of the output clock signals $V_o$ and $V^*_o$ may be "fine-tuned" through the selection of $V_{fine}$ and "coarse-turned through the selection of $V_{coarse}$.

Figure 6:
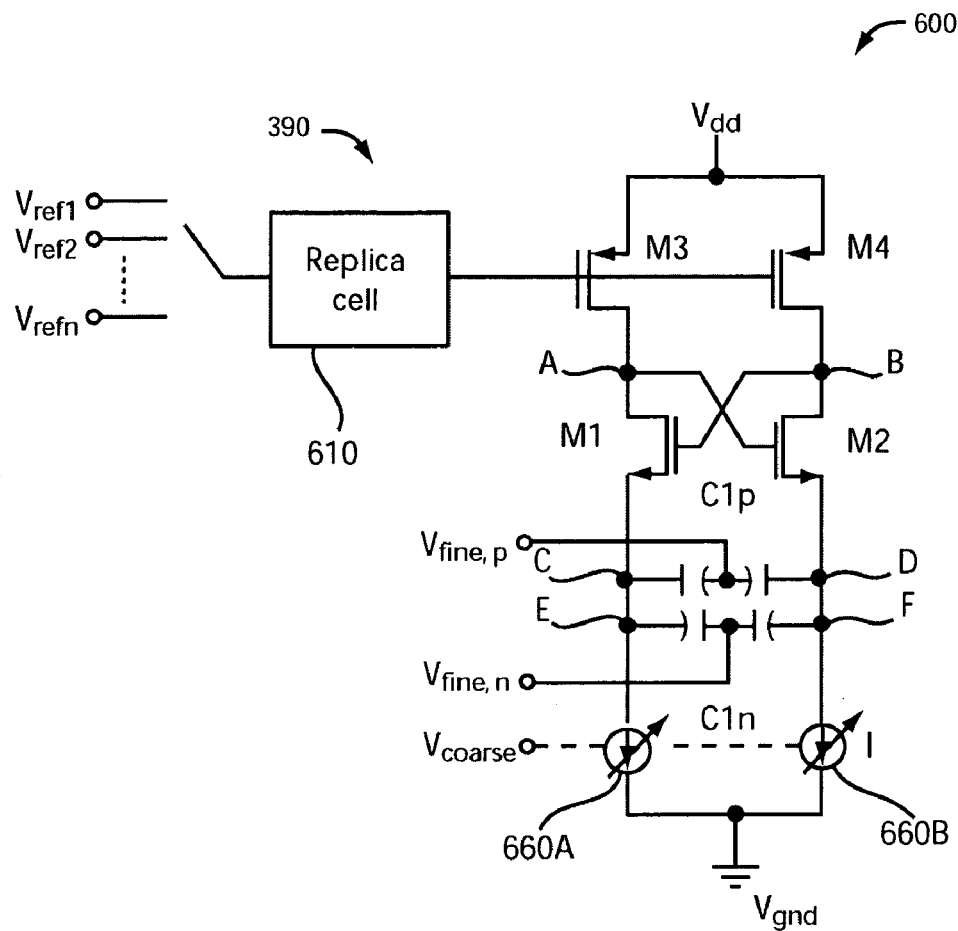
FIG. 6 is a diagram illustrating the triple-input relaxation oscillator of FIG. 5 in accordance with an exemplary embodiment thereof.

Turning to FIG. 6, the triple-input relaxation oscillator of FIG. 5 is shown in further detail in accordance with an exemplary embodiment thereof. Of course, given the teachings of the present invention provided herein, one of ordinary skill in this and related arts will contemplate these and other elements for implementing the elements shown and described with respect to FIG. 6, while maintaining the scope of the present invention.

The swing fixing circuit 530 is implemented by replica cell 510 and p-channel CMOS load transistors (hereinafter "load transistors") M3 and M4. Thus, the variable resistance load 520 of the swing fixing circuit 330 is implemented by the load transistors M3 and M4.

The switching block 540 is implemented by n-channel CMOS switching transistors (hereinafter "switching transistors") M1 and M2.

The fine-tuning differentially controlled varactors 550 are implemented by capacitors C1p and C1n. The current source 560 is implemented by ground current sources (hereinafter "current sources") 560A and 560B. The delay control circuit 599 is implemented by the capacitors C1p and C1n and the ground current sources 560A and 560B.

Respective sources of the load transistors M3 and M4 are connected in signal communication with a supply voltage $V_{dd}$, and respective gates of the load transistors M3 and M4 are connected in signal communication with an output of a replica cell 510. An input of the replica cell is configured to receive one of a plurality of reference voltages $V_{ref1}$ through $V_{refn}$. Respective drains of the transistors M3 and M4 are connected in signal communication with nodes A and B, respectively, with respective drains of switching transistors M1 and M2, respectively, and with respective gates of switching transistors M2 and M1, respectively. The respective source of switching transistor M1 is connected in signal communication with Nodes C and E (which are electrically the same, and hereinafter referred to collectively as Node C). The respective source of switching transistor M2 is connected in signal communication with Nodes D and F (which are electrically the same, and hereinafter referred to collectively as Node D). Node C is connected in signal communication with a first end of the fine-tuning varactors C1p and C1n and with a first terminal of current source 540A. Node D is connected in signal communication with a second end of the fine-tuning varactors C1p and C1n, and with a first terminal of current source 540B. Respective second terminals of the current sources 540A and 540B are connected in signal communication with a ground voltage $V_{gnd}$.

Figure 1A:
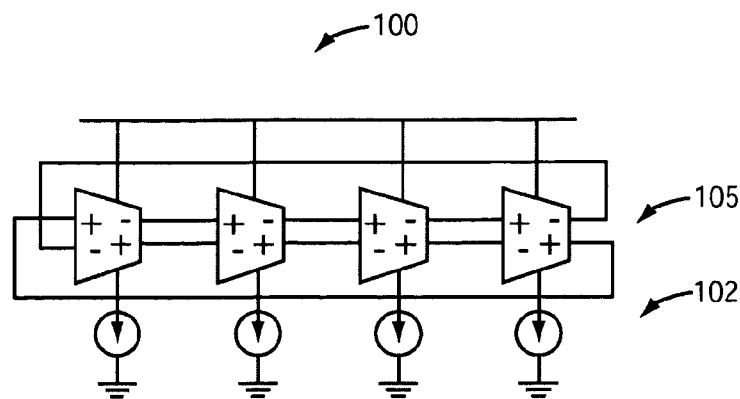
FIG. 1A is a diagram illustrating a differential ring oscillator according to the prior art.
Figure 1B:
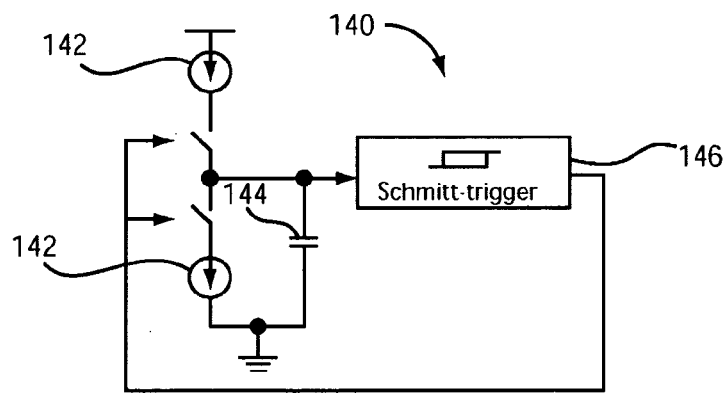
FIG. 1B is a diagram illustrating a relaxation oscillator with grounded capacitor in accordance with the prior art.
Figure 1C:
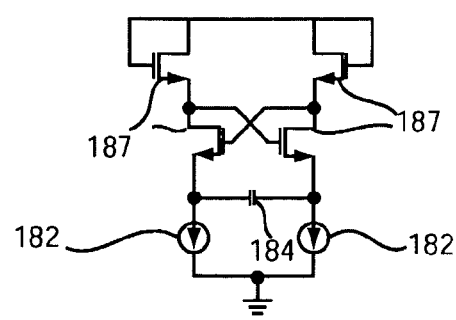
FIG. 1C is a diagram illustrating a relaxation oscillator with floating capacitor in accordance with the prior art.
Figure 2:
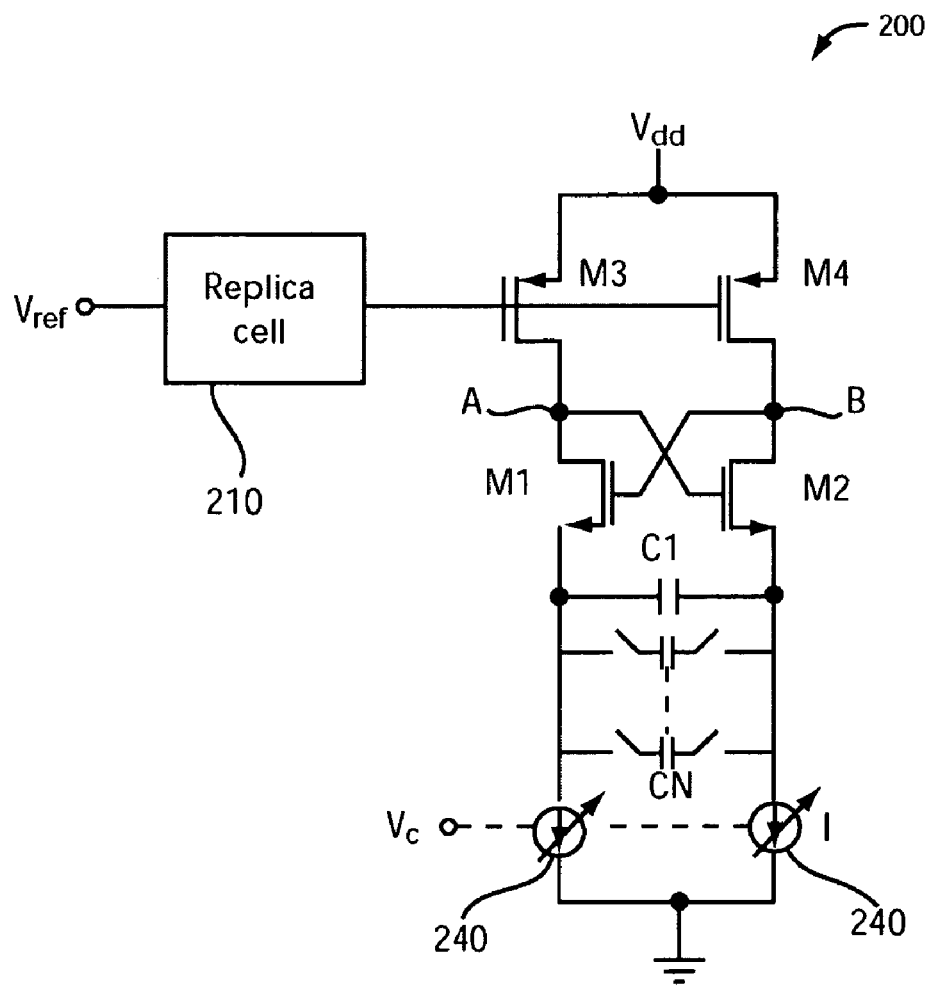
FIG. 2 is a diagram illustrating a digitally programmable relaxation oscillator having a fixed swing control block in accordance with the prior art.

The relaxation oscillator 600 employs differentially controlled varactors, which provide extended linear tuning. Therefore, compared to conventional current-starved ring VCOs such as that shown in FIG. 1, the relaxation oscillator 600 provides better immunity to supply noise, a wider linear tuning range, less VCO gain variation, and better noise performance.

The relaxation oscillator 600 provides differential control of the varactors via a positive voltage control signal $V_{fine,p}$ and a negative voltage control signal $V_{fine,n}$, wherein two varactors are connected in parallel. The connection of the two varactors C1p and C1n in this manner serves to equalize the parasitic capacitance of the circuit and to linearize the varactor tuning curve. A differentially controlled input voltage provides more immunity to noise coupling as well as a wider linear range in fine-tuning control of the VCO.

Figure 7:
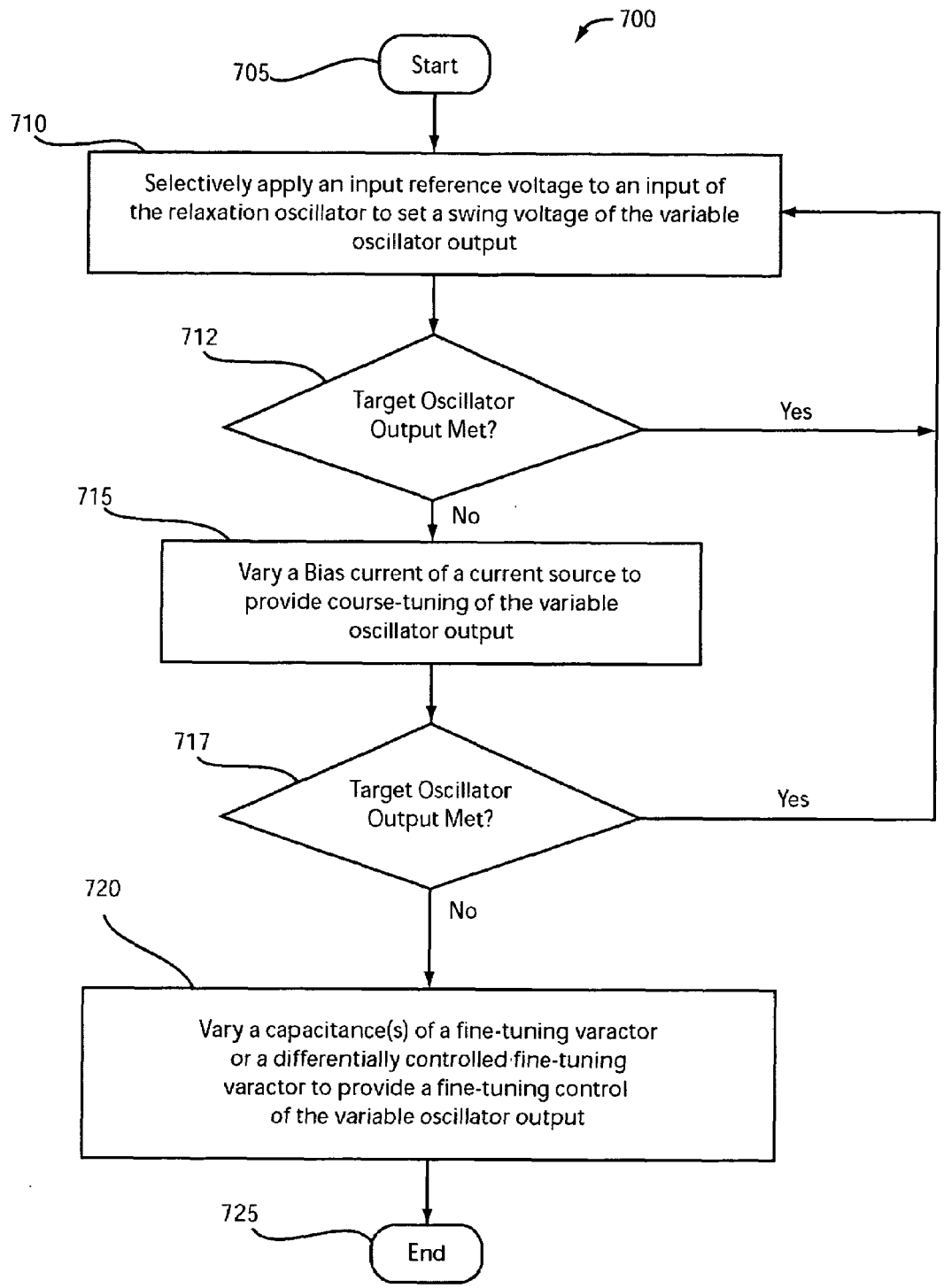
FIG. 7 is a diagram illustrating a method for controlling a relaxation oscillator in accordance with the present principles.

Turning to FIG. 7, a method for controlling a relaxation oscillator is indicated generally by the reference numeral 700.

A start block 705 passes control to a function block 710. The function block 710 selectively applies one of a plurality of input reference voltages to an input of the relaxation oscillator to set a swing voltage of the variable oscillator output, and passes control to a decision block 712. The decision block 712 determined whether or not the target oscillator output has been met. If so, then control is returned to function block 710. Otherwise, control is then passed to a function block 715.

The function block 715 varies a bias current of a current source to provide a coarse-tuning of the variable oscillator output, and passes control to a decision block 717. The decision block 717 determined whether or not the target oscillator output has been met. If so, then control is returned to function block 710. Otherwise, control is then passed to a function block 720.

The function block 720 varies a capacitance of a fine-tuning varactor or a differentially controlled fine-tuning varactor to provide a fine-tuning control of the variable oscillator output, and passes control to an end block 725. It is to be appreciated that fine-tuning of the output clock signals $V_o$ and $V^*_o$ may involve selecting Vfine in the case of the relaxation oscillators of FIGS. 3 and 4, or may involve selecting $V_{fine,n}$ and $V_{fine,p}$ in the case of the relaxation oscillators of FIGS. 5 and 6.

It is to be further appreciated that while embodiments herein have been described with respect to n-channel and p-channel CMOS switching transistors, other types of transistors, other configurations (e.g., using n-channel devices in place of shown p-channel devices, etc.), and/or other electronic devices may also be utilized in accordance with the present principles, given the teachings of the present principles provided herein.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A relaxation oscillator, comprising:
a load device, configured to provide a variable oscillator output based on a variable input reference voltage;
a switching device, connected in signal communication with said load device, configured to become active and inactive based on the variable oscillator output;
a fine-tuning varactor, connected in signal communication with said switching device, configured to provide fine-tuning of the variable oscillator output when said switching device is active; and
a current source, connected in signal communication with said switching device, and configured to provide coarse-tuning of the variable oscillator output when said switching device is active,
wherein said fine-tuning varactor comprises at least one capacitor configured without a corresponding inductor to provide the fine-tuning of the variable oscillator output in response to an analog input voltage provided via a control input of said fine-tuning varactor when said switching device is active.

2. The relaxation oscillator of claim 1, wherein said fine-tuning varactor comprises a differentially controlled fine-tuning varactor configured to minimize noise and expand the linear range of the variable oscillator output.

3. The relaxation oscillator of claim 2, wherein the differentially controlled fine-fining varactor comprises at least two varactors connected in parallel to minimize a parasitic capacitance.

4. The relaxation oscillator of claim 3, wherein at least one of the two varactors has a capacitance that is controllable via a positive voltage control signal, and at least another one of the two varactors has a capacitance that is controllable via a negative voltage control signal.

5. The relaxation oscillator of claim 1, further comprising a replica cell, connected in signal communication with the load device, configured to pass one of a plurality of input reference voltages to the load device to set a swing voltage of the variable oscillator output.

6. The relaxation oscillator of claim 5, wherein the plurality of input reference voltages are digitally programmable.

7. The relaxation oscillator of claim 1, wherein said current source is configured to provide a digitally programmable bias current.

8. A relaxation oscillator, comprising:
first and second load transistors, each having a gate configured to receive a reference voltage, a source configured to receive a supply voltage, and a drain;
first and second switching transistors, each having a respective drain connected in signal communication with the drain of the first and second load transistors, respectively, a respective gate connected in signal communication with the drain of the second and first load transistors, respectively, and a source;
a fine-tuning varactor, having first and second ends connected in signal communication with the respective source of the first and second switching transistors, respectively, configured to provide fine-tuning of an oscillator output; and
first and second current sources, each having a first terminal configured to receive a ground voltage, and a second terminal connected in signal communication with the first end and the second end, respectively, of the fine-tuning varactor, configured to provide coarse-tuning of the oscillator output,
wherein said fine-tuning varactor comprises at least one capacitor configured without a corresponding inductor to provide the fine-tuning of the oscillator output in response to an analog input voltage provided via a control input of said fine-tuning varactor when said first and second switching transistors are active.

9. The relaxation oscillator of claim 8, wherein said fine-tuning varactor comprises a differentially controlled fine-tuning varactor.

10. The relaxation oscillator of claim 9, wherein the differentially controlled fine-tuning varactor comprises at least two varactors connected in parallel to enhance linearity of voltage-to-capacitance tuning curve with a differential control input.

11. The relaxation oscillator of claim 10, wherein at least one of the two varactors has a capacitance that is controllable via a positive voltage control signal, and at least another one of the two varactors has a capacitance that is controllable via a negative voltage control signal.

12. The relaxation oscillator of claim 8, further comprising a replica cell, connected in signal communication with the base of the first and second load transistors, configured to pass thereto one of a plurality of input reference voltages to set a swing voltage of the oscillator output.

13. The relaxation oscillator of claim 12, wherein the plurality of input reference voltages are digitally programmable.

14. The relaxation oscillator of claim 8, wherein said first and second current sources are configured to provide a digitally programmable bias current.

15. A method of controlling a relaxation oscillator having a variable oscillator output, the method comprising:
- configuring a capacitor as a varactor without a corresponding inductor;
- varying a capacitance of the varactor to provide fine-tuning of the variable oscillator output; and
- varying a bias current of a current source to provide coarse-tuning of the variable oscillator output.

16. The method of claim 15, wherein the varactor is a differentially controlled fine-tuning varactor, and said step of controlling the capacitance of the varactor comprises controlling capacitances of the differentially controlled fine-tuning varactor.

17. The method of claim 16, wherein the differentially controlled fine-tuning varactor comprises at least two varactors connected in parallel, and said step of controlling the capacitances of the differentially controlled fine-tuning varactor comprises:
- controlling a capacitance of at least one of the two varactors via a positive voltage control signal; and
- controlling a capacitance of at least another one of the two varactors via a negative voltage control signal.

18. The method of claim 15, further comprising selectively applying one of a plurality of input reference voltages to an input of the relaxation oscillator to set a swing voltage of the variable oscillator output.

19. The method of claim 15, wherein said capacitance varying step provides the fine-tuning of the variable oscillator output in response to an analog input voltage provided via a control input of the varactor.

* * * * *